(12) United States Patent
Chyi et al.

(10) Patent No.: US 10,868,128 B2
(45) Date of Patent: Dec. 15, 2020

(54) OHMIC CONTACT STRUCTURE, SEMICONDUCTOR DEVICE INCLUDING AN OHMIC CONTACT STRUCTURE, AND METHOD FOR FORMING THE SAME

(71) Applicants: Taiwan Semiconductor Manufacturing Company, Ltd., Hsinchu (TW); National Taiwan University, Taipei (TW)

(72) Inventors: Jen-Inn Chyi, Zhongli (TW); Cheng-Han Tsou, Caotun Township (TW); Szu-Hung Chen, Taoyuan (TW)

(73) Assignees: Taiwan Semiconductor Manufacturing Company, Ltd., Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 16/265,431

(22) Filed: Feb. 1, 2019

(65) Prior Publication Data
US 2020/0006511 A1 Jan. 2, 2020

Related U.S. Application Data

(60) Provisional application No. 62/692,105, filed on Jun. 29, 2018.

(51) Int. Cl.
*H01L 29/45* (2006.01)
*H01L 21/285* (2006.01)
(Continued)

(52) U.S. Cl.
CPC ...... *H01L 29/452* (2013.01); *H01L 21/28518* (2013.01); *H01L 21/28568* (2013.01);
(Continued)

(58) Field of Classification Search
CPC ......... H01L 29/66477; H01L 29/66522; H01L 29/41725; H01L 29/41733;
(Continued)

(56) References Cited

U.S. PATENT DOCUMENTS 5,776,827 A * 7/1998 Hibino ................ H01L 21/2855
257/E21.169
8,772,109 B2 7/2014 Colinge
(Continued)

OTHER PUBLICATIONS

Baraskar, A. et al., "Ultralow resistance, nonalloyed Ohmic contacts to n-InGaAs," American Vacuum Society, J. Vac. Sci. Technol. B 27 (4), Jul./Aug. 2009, 5 Pages.
(Continued)

*Primary Examiner* — Sonya McCall-Shepard
(74) *Attorney, Agent, or Firm* — Slater Matsil, LLP

(57) ABSTRACT

Semiconductor contact structures, a semiconductor device including the semiconductor contact structures, and a method for forming the same are disclosed. In an embodiment, a semiconductor device includes a channel layer on a substrate; an interface layer on the channel layer, the interface layer including titanium (Ti), the interface layer contacting the channel layer; and a contact metal layer over the interface layer, the contact metal layer including aluminum silicon copper alloy (AlSiCu).

20 Claims, 19 Drawing Sheets

(51) Int. Cl.

| | | |
|---|---|---|
| *H01L 29/66* | (2006.01) | |
| *H01L 29/49* | (2006.01) | |
| *H01L 29/51* | (2006.01) | |
| *H01L 23/485* | (2006.01) | |
| *H01L 23/532* | (2006.01) | |
| *H01L 21/311* | (2006.01) | |
| *H01L 29/207* | (2006.01) | |
| *H01L 21/265* | (2006.01) | |
| *H01L 21/266* | (2006.01) | |

(52) U.S. Cl.
CPC ........ *H01L 21/28575* (2013.01); *H01L 29/45* (2013.01); *H01L 29/66477* (2013.01); *H01L 29/66522* (2013.01); *H01L 21/266* (2013.01); *H01L 21/26546* (2013.01); *H01L 21/31111* (2013.01); *H01L 29/207* (2013.01); *H01L 29/4966* (2013.01); *H01L 29/517* (2013.01)

(58) Field of Classification Search
CPC . H01L 29/41775; H01L 29/45; H01L 29/452; H01L 29/454; H01L 29/49; H01L 21/768–76811; H01L 23/522; H01L 23/5329; H01L 23/53204–53238; H01L 21/28; H01L 21/28008–28044; H01L 21/28079–28097; H01L 21/28114; H01L 2221/10–1036; H01L 2221/1068–1073; H01L 29/41783; H01L 29/7839; H01L 29/806; H01L 29/66568
See application file for complete search history.

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2006/0244009 A1* | 11/2006 | Choug | H01L 29/7783 257/194 |
| 2012/0217591 A1* | 8/2012 | Kamada | H01L 23/53252 257/410 |
| 2013/0248873 A1* | 9/2013 | Kuraguchi | H01L 29/4966 257/76 |
| 2014/0264380 A1* | 9/2014 | Kub | H01L 21/0262 257/77 |
| 2019/0043715 A1* | 2/2019 | Lee | H01L 29/20 |

OTHER PUBLICATIONS

Crook, A. et al., "Low resistance, nonalloyed Ohmic contacts to InGaAs," Applied Physics Letters, American Institute of Physics, 192114, 2007, 4 Pages.

Kim, S. et al., "High-Performance InAs-On-Insulator n-MOSFETs With Ni-InGaAs S/D Realized by Contact Resistance Reduction Technology," IEEE Transactions on Electron Devices, Oct. 2013, 9 Pages, vol. 60, No. 10.

Lee, J. et al., "Contact Resistance Reduction between Ni-InGaAs and n-InGaAs via Rapid Thermal Annealing in Hydrogen Atmosphere," Journal of Semiconductor Technology and Science, Apr. 2017, 5 Pages, vol. 17, No. 2.

Lin, J. et al., "Analysis of Resistance and Mobility in InGaAs Quantum-Well MOSFETs From Ballistic to Diffusive Regimes," IEEE Transactions on Electron Devices, Apr. 2016, 7 pages, vol. 63, No. 4.

Lu, W. et al., "A Test Structure to Characterize Nano-Scale Ohmic Contacts in III-V MOSFETs," IEEE Electron Device Letters, Feb. 2014, 3 Pages, vol. 35, No. 2.

Ravaux, F. et al., "Characterization of metal contact to III-V materials (Mo/InGaAs)," Microelectronic Engineering 145, Feb. 2015, 4 Pages.

Wu, J. et al., "The Thermal Stability of Ohmic Contact to n-type InGaAs Layer," Journal of Electronic Materials, 1995, 4 Pages, vol. 24, No. 2.

* cited by examiner

OHMIC CONTACT STRUCTURE, SEMICONDUCTOR DEVICE INCLUDING AN OHMIC CONTACT STRUCTURE, AND METHOD FOR FORMING THE SAME

CROSS-REFERENCE TO RELATED APPLICATIONS

This application claims the benefit of U.S. Provisional Application No. 62/692,105, filed on Jun. 29, 2018, entitled "Contact Structures for Semiconductor Devices and Methods of Forming the Same," which patent application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
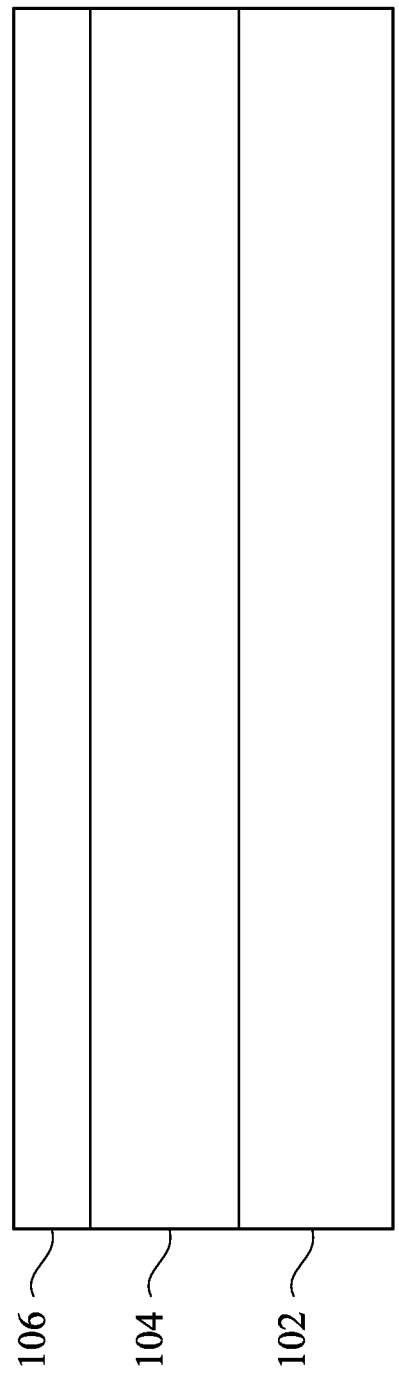
FIG. 1 illustrates a cross-sectional view of a semiconductor substrate in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide conductive contacts which may be used in planar metal-oxide-semiconductor field-effect transistors (MOSFETs), fin field-effect transistors (FinFETs), gate-all-around field-effect transistors (GAA FETs), or the like, and processes for forming the same. The conductive contacts may include a titanium (Ti) layer and an aluminum-silicon-copper (AlSiCu) layer over the titanium layer. The conductive contacts may be formed in contact with a channel layer, which is disposed on a buffer layer disposed over a semiconductor substrate. The channel layer may comprise indium gallium arsenide (InGaAs), the buffer layer may comprise indium aluminum arsenide (InAlAs), and the semiconductor substrate may comprise indium phosphide (InP). The conductive contacts according to embodiments of the present application may be formed of materials which are compatible with complementary metal-oxide-semiconductor (CMOS) manufacturing processes as well as silicon-based MOSFET manufacturing processes. Because the conductive contacts of the present application are gold-free, the cost of producing the conductive contacts is reduced. Moreover, the conductive contacts may have low specific contact resistance and may provide an ohmic contact. The conductive contacts may be used in tunneling field-effect transistors (TFETs), planar metal-oxide semiconductor field-effect transistors (MOSFETs), fin field-effect transistors (FinFETs), gate-all-around field-effect transistors (GAA FETs), and the like.

Referring to FIG. 1, a substrate 102 having a buffer layer 104 and a channel layer 106 disposed thereover is illustrated. The substrate 102 may include a semiconductor material and may be, for example, a bulk silicon wafer, a bulk germanium wafer, a semiconductor-on-insulator (SOI) substrate, or a strained semiconductor-on-insulator (SSOI) substrate. The semiconductor material of the substrate 102 may include a first semiconductor material, such as a group IV element, e.g., germanium or silicon. In some embodiments, the semiconductor material of the substrate 102 may include indium phosphide (InP), silicon germanium ($Si_xGe_{(1-x)}$), silicon (Si), germanium (Ge), silicon carbide (SiC), sapphire ($Al_2O_3$), combinations thereof, or the like. The substrate 102 may be a multi-layered or gradient substrate.

The buffer layer 104 may be formed of a material having a high resistivity and may be used to isolate the channel layer 106 and a subsequently formed transistor from the substrate 102 and from other devices formed on the substrate 102. For example, a resistivity of the buffer layer 104 may be greater than about $10^5$ Ω·cm, such as about $10^6$ Ω·cm. The buffer layer may be formed of a material such as $Al_xGa_{(1-x)}Sb$; $In_xGa_{(1-x)}As$; $In_xGa_{(1-x)}P$; $In_xAl_{(1-x)}As$; $In_xGa_{(1-x)}N$; $Al_xGa_{(1-x)}N$; $Si_xGe_{(1-x)}$; $Al_xSb_{(1-x)}$; $Ga_xSb_{(1-x)}$; alloys, combinations, or multiple layers thereof; or the like. In at least one embodiment, the buffer layer 104 may comprise InAlAs. The buffer layer 104 may be formed on the substrate 102 by epitaxial growth, e.g., molecular beam epitaxy (MBE), vapor-phase epitaxy (VPE), or liquid-phase epitaxy (LPE); chemical vapor deposition (CVD), e.g., metalorganic CVD (MOCVD), low pressure CVD (LPCVD), atomic layer deposition (ALD), ultrahigh vacuum CVD (UHVCVD), reduced pressure CVD (RPCVD); combinations thereof, or any other suitable deposition processes. The buffer layer 104 may have a thickness of between about 0.5 μm and about 2.0 μm, such as about 0.6 μm.

As will be discussed in greater detail below, in various embodiments, a portion of the channel layer 106 may be used to form a channel for a transistor. The channel layer 106 may comprise semiconductor materials including indium gallium arsenide ($In_xGa_{(1-x)}As$), indium gallium phosphide ($In_xGa_{(1-x)}P$), indium aluminum arsenide ($In_xAl_{(1-x)}As$), indium gallium nitride ($In_xGa_{(1-x)}N$), aluminum gallium nitride ($Al_xGa_{(1-x)}N$), silicon-germanium ($Si_xGe_{(1-x)}$), indium arsenide ($In_xAs_{(1-x)}$), combinations or multiple layers thereof, or the like. The channel layer 106 may be formed on the substrate 102 by epitaxial growth. e.g., molecular beam epitaxy (MBE), vapor-phase epitaxy (VPE), or liquid-phase epitaxy (LPE); chemical vapor deposition (CVD). e.g., metalorganic CVD (MOCVD), low pressure CVD (LPCVD), atomic layer deposition (ALD), ultrahigh vacuum CVD (UHVCVD), reduced pressure CVD (RPCVD); combinations thereof, or any other suitable deposition processes. The channel layer 106 may have a thickness of less than about 200 nm, such as about 190 nm or about 167.9 nm, or less than about 100 nm, such as about 50 nm.

The material of the channel layer 106 may be undoped. In some embodiments, the channel layer 106 may be slightly doped (e.g., the channel layer 106 may have a dopant concentration of less than about $10^{17}$ $cm^{-3}$). For example, in embodiments in which an n-type device is formed over the substrate 102, the channel layer 106 may be slightly p-type doped. In embodiments in which a p-type device is formed over the substrate 102, the channel layer 106 may be slightly n-type doped. N-type dopant ions which may be implanted in the channel layer 106 include silicon (Si), germanium (Ge), tin (Sn), or the like and p-type dopant ions which may be implanted into the channel layer 106 include beryllium (Be), zinc (Zn), carbon (C), or the like.

In at least one embodiment, the substrate 102 may comprise indium phosphide (InP), the buffer layer 104 may comprise indium aluminum arsenide (InAlAs), and the channel layer 106 may comprise indium gallium arsenide (InGaAs). As such, the materials of the substrate 102, the buffer layer 104, and the channel layer 106 may be lattice matched.

Figure 2:
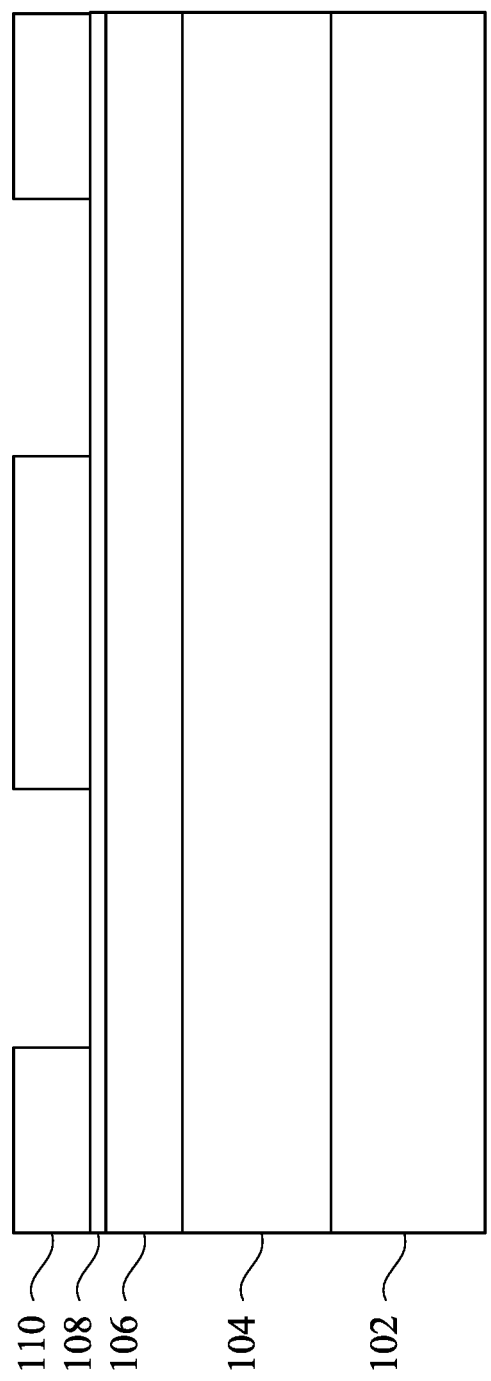
FIG. 2 illustrates a cross-sectional view of a formation of a dielectric layer and a patterned photoresist in accordance with some embodiments.

In FIG. 2, a first dielectric layer 108 and a first photoresist 110 are formed over the channel layer 106. The first dielectric layer 108 may be used to prevent damage to the underlying channel layer 106 during a subsequent ion implantation (e.g., the ion implantation process 112 described below in reference to FIG. 3). The first dielectric layer 108 may be formed of silicon dioxide ($SiO_2$) or the like. The first dielectric layer 108 may be deposited using a deposition process such as atomic layer deposition (ALD), physical vapor deposition (PVD), chemical vapor deposition (CVD), combinations thereof, or the like. The first dielectric layer 108 may have a thickness of between about 10 nm and about 50 nm, such as about 20 nm.

As further illustrated in FIG. 2, the first photoresist 110 is then formed over the first dielectric layer 108. The first photoresist 110 may be deposited using a spin-on technique or the like. The first photoresist 110 may be patterned by exposing the first photoresist 110 to a patterned energy source (e.g., a patterned light source, an electron beam (e-beam) source, or the like) and exposing the patterned first photoresist 110 to a developer solution. As illustrated in FIG. 2, the first photoresist 110 may be patterned to form openings exposing the first dielectric layer 108.

Figure 3:
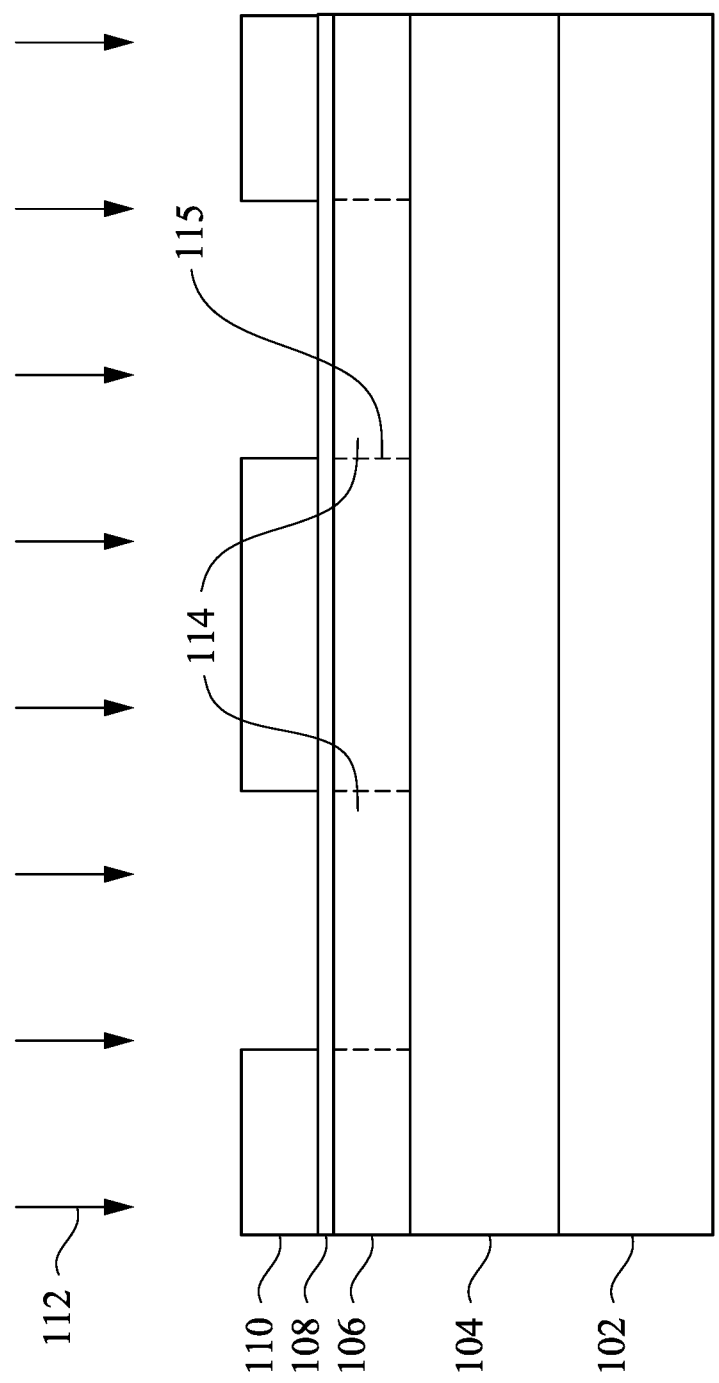
FIG. 3 illustrates a cross-sectional view of an ion implantation process in accordance with some embodiments.

In FIG. 3, an ion implantation process 112 is performed over the first photoresist 110 and the first dielectric layer 108. The ions may pass through the first dielectric layer 108 and may be implanted in the channel layer 106 to form source/drain regions 114. Portions of the channel layer 106 disposed between the source/drain regions 114 may form a channel region 115. In embodiments in which an n-type device is formed over the substrate 102, the ion implantation process 112 may implant n-type dopant ions such as silicon (Si), selenium (Se), tin (Sn), or the like into the channel layer 106. In embodiments in which a p-type device is formed over the substrate 102, the ion implantation process 112 may implant p-type dopant ions such as beryllium (Be), zinc (Zn), or the like into the channel layer 106.

The ion implantation process 112 may be performed using an energy in a range of between about 7.5 keV and about 37.5 keV, such as about 15 keV or about 25 keV with a dosage in a range from about $5 \times 10^{13}$ ion/$cm^2$ to about $7.5 \times 10^{14}$ ion/$cm^2$, such as about $1 \times 10^{14}$ ion/$cm^2$ or about $5 \times 10^{14}$ ion/$cm^2$. The ion implantation process 112 may be performed at a temperature in a range of about 500° C. and about 800° C. In some embodiments, the dopant concentration in areas of the channel layer 106 exposed to the ion implantation process 112 may be in a range of between about $2.0 \times 10^{18}$ cm$^{-3}$ and about $6.2 \times 10^{18}$ cm$^{-3}$, such as about $4.1 \times 10^{18}$ cm$^{-3}$. In at least one embodiment, silicon may be implanted in the channel layer 106 such that a concentration of silicon ions in the exposed portions of the channel layer is between about $1 \times 10^{18}$ cm$^{-3}$ and about $1 \times 10^{20}$ cm$^{-3}$.

Accordingly, the ion implantation process 112 is used to form the source/drain regions 114. Following the ion implantation process 112, the source/drain regions 114 may have an increased electron concentration and reduced contact resistance when compared with unexposed portions of the channel layer 106. The channel region 115 disposed between the source/drain regions 114 may act as a channel for the subsequently formed transistor.

Following the ion implantation process 112, the implanted ions may be activated through a rapid thermal annealing (RTA) process (not separately illustrated). The RTA process may be performed at a temperature of between about 500° C. and about 800° C., such as about 650° C. for a period of between about 5 seconds and about 100 seconds, such as about 30 seconds. The RTA process may be performed in a nitrogen (N$_2$) ambient environment.

Figure 4:
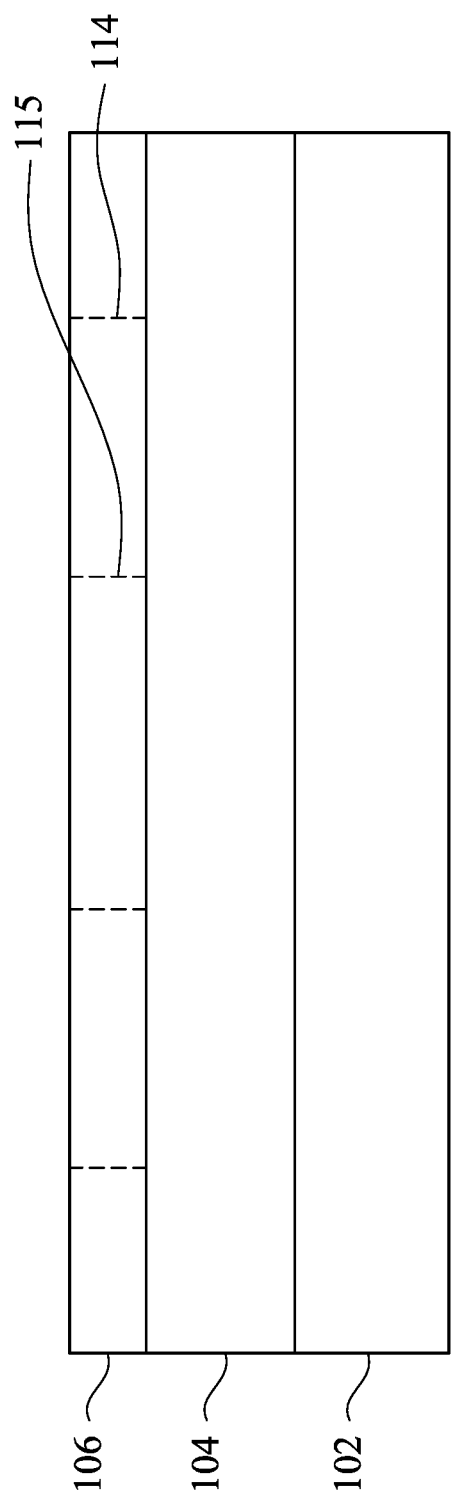
FIG. 4 illustrates a cross-sectional view of a removal of the screen layer and the patterned photoresist in accordance with some embodiments.

In FIG. 4, the first dielectric layer 108 and the first photoresist 110 are removed from above the channel layer 106 following the RTA process. The first dielectric layer 108 and the first photoresist 110 may be removed by a suitable etch process. In some embodiments, the etch process may be an isotropic etch process, such as a wet etch process or a chemical etch process. In other embodiments, the etch process may be an anisotropic etch process, such as a dry etch process. In at least one embodiment, the first dielectric layer 108 and the first photoresist 110 may be removed by a wet etch process using an etchant comprising hydrofluoric acid (HF), such as diluted HF (dHF). In the dHF, the HF may be diluted in deionized water (DIW) at a ratio of about 1:10 (HF:DIW).

Figure 5:
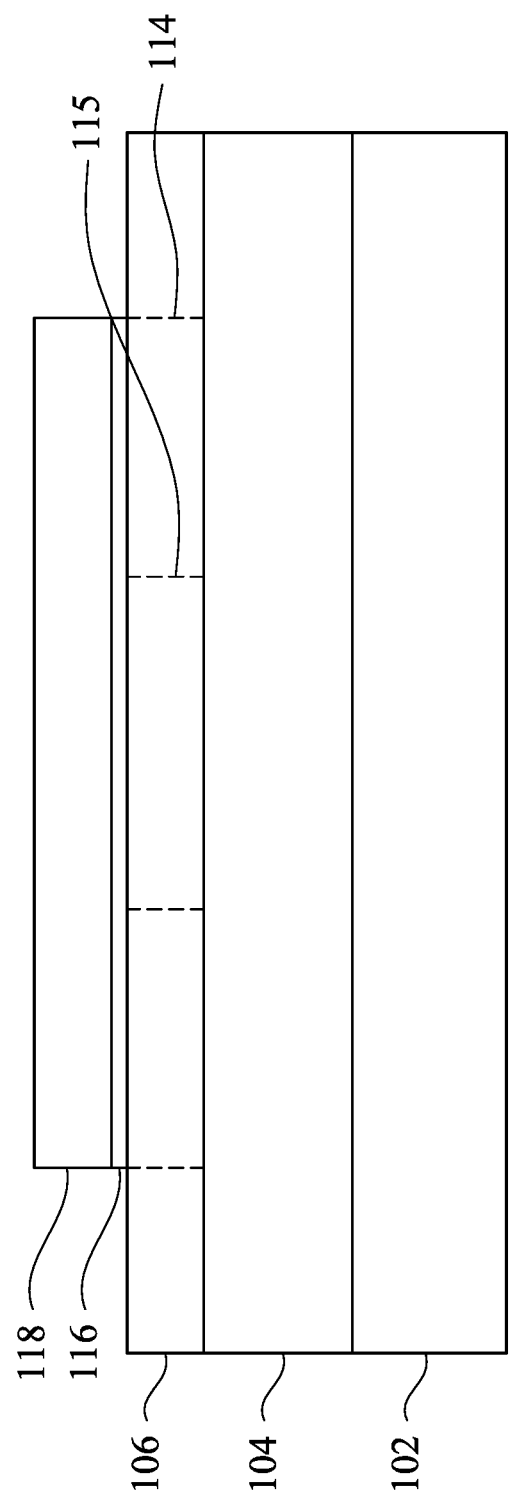
FIG. 5 illustrates a cross-sectional view of a formation of a hard mask layer and a patterned photoresist in accordance with some embodiments.

In FIG. 5, a second dielectric layer 116 and a second photoresist 118 are formed over the channel layer 106 and the source/drain regions 114. The second dielectric layer 116 may be a hard mask layer. The second dielectric layer 116 may be formed of silicon dioxide (SiO$_2$) silicon nitride (SiN), combinations or multiple layers thereof, or the like. The second dielectric layer 116 may be deposited on the channel layer 106 and the source/drain regions 114 using a deposition process such as atomic layer deposition (ALD), physical vapor deposition (PVD), chemical vapor deposition (CVD), combinations thereof, or the like. The second dielectric layer 116 may have a thickness of between about 20 nm and about 60 nm, such as about 40 nm.

The second photoresist 118 may be deposited on the second dielectric layer 116 using a spin-on technique or the like. The second photoresist 118 may be patterned by exposing the second photoresist 118 to a patterned energy source (e.g., a patterned light source, an electron beam (e-beam) source, or the like) and exposing the patterned second photoresist 118 to a developer solution. As illustrated in FIG. 5, the second photoresist 118 may be patterned to cover the source/drain regions 114 as well as the channel region formed between the source/drain regions 114.

After the second photoresist 118 is patterned, the second dielectric layer 116 may be etched through openings formed in the second photoresist 118. The second dielectric layer 116 may be etched by any suitable etch process, such as a dry etch process. In some embodiments, the second dielectric layer 116 may be etched by a dry etch process such as reactive-ion etching (RIE), neutral-beam etching (NBE), combinations thereof, or the like. The etching process used to etch the second dielectric layer 116 may be anisotropic.

Figure 6:
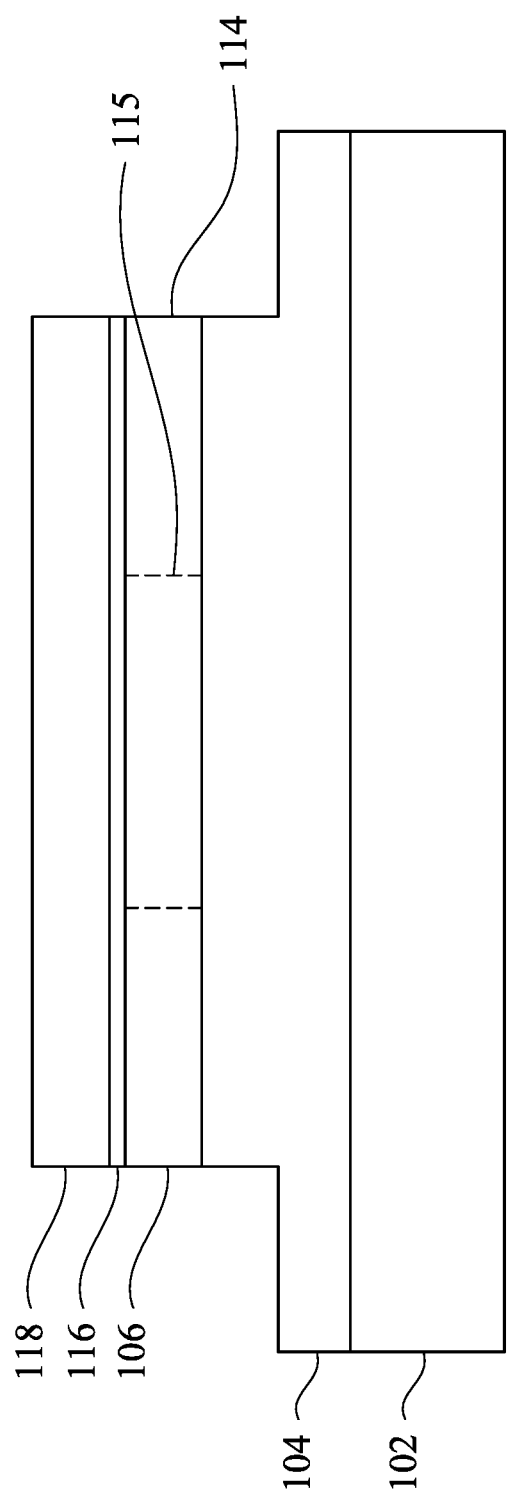
FIG. 6 illustrates a cross-sectional view of an etching of a channel layer and a buffer layer in accordance with some embodiments.

In FIG. 6, the channel layer 106 and the buffer layer 104 are etched. As illustrated in FIG. 6, the channel layer 106 may be etched such that the source/drain regions 114 and the channel region 115 remain. The channel layer 106 and the buffer layer 104 may be etched using any suitable etch process. The etch process may be an anisotropic etch process, such as a dry etch process. In some embodiments, the channel layer 106 and the buffer layer 104 may be etched by a dry etch process such as reactive-ion etching (RIE), neutral-beam etching (NBE), combinations thereof, or the like. The channel layer 106 and the buffer layer 104 may be etched by the same etch process as the second dielectric layer 116 and, in some embodiments, the second dielectric layer 116, the channel layer 106, and the buffer layer 104 may be etched simultaneously.

As illustrated in FIG. 6, a portion of the buffer layer 104 may remain above the substrate 102 in the area exposed to the etch process outside of the area covered by the second photoresist 118 and the second dielectric layer 116. The portion of the buffer layer 104 disposed outside of the area covered by the second photoresist 118 may be used to isolate a subsequently formed device from other devices formed over the substrate 102.

Figure 7:
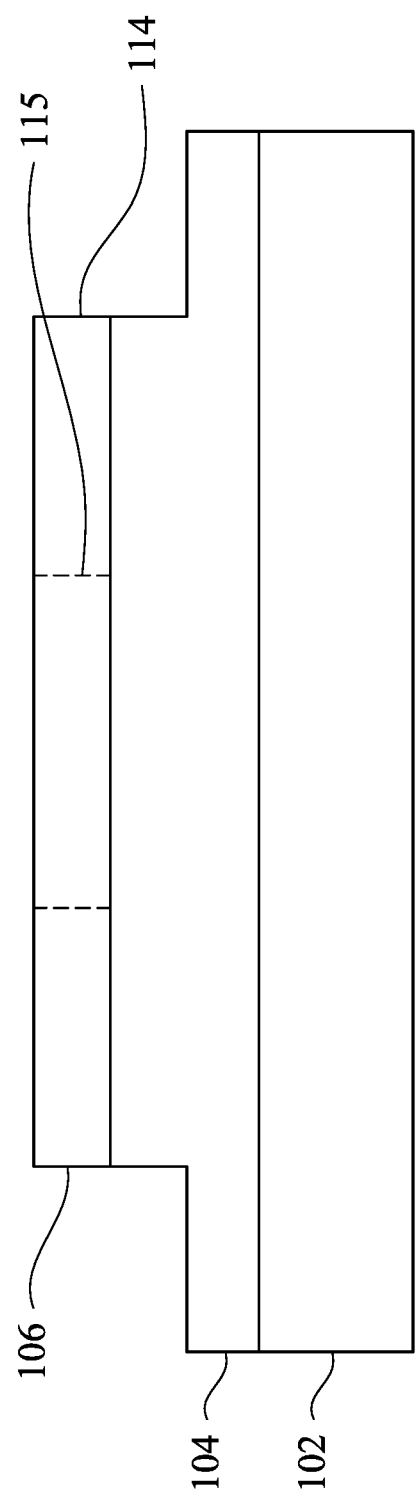
FIG. 7 illustrates a cross-sectional view of a removal of the hard mask layer and the patterned photoresist in accordance with some embodiments.

In FIG. 7, the second dielectric layer 116 and the second photoresist 118 are removed from above the channel layer 106. The second dielectric layer 116 and the second photoresist 118 may be removed by the same etch process as or a similar etch process to the first dielectric layer 108 and the first photoresist no. The etch process used to remove the second dielectric layer 116 and the second photoresist 118 may also be used to clean the surfaces of the structure illustrated in FIG. 7 and to remove a native oxide formed on surfaces of the structure illustrated in FIG. 7. For example, a wet etch process using an etchant comprising HF, such as dHF may be used to remove the second dielectric layer 116, the second photoresist 118, and any native oxide formed on the channel layer 106 or the buffer layer 104. In the dHF, the HF may be diluted in DIW at a ratio of about 1:10 (HF:DIW).

In some embodiments, the channel layer 106 may be formed of germanium (Ge) or the like. In embodiments in which the channel layer 106 comprises germanium, the channel layer 106 may be subjected to a rapid thermal oxidation process to form a conformal oxide layer (not separately illustrated) over the surfaces of the channel layer 106 and the buffer layer 104. This step may be optional.

The surfaces of the channel layer 106 and the buffer layer 104 may then be subjected to a plasma treatment, such as a nitrogen plasma. The nitrogen plasma may be used to nitride surfaces of the channel layer 106 and the buffer layer 104. Nitriding the surfaces of the channel layer 106 and the buffer layer 104 reduce an interface state density between the channel layer 106 and the buffer layer 104 and a subsequently formed gate dielectric layer 120 (discussed below in reference to FIG. 8), improving the interface between the channel layer 106 and the buffer layer 104 and the gate dielectric layer 120.

Figure 8:
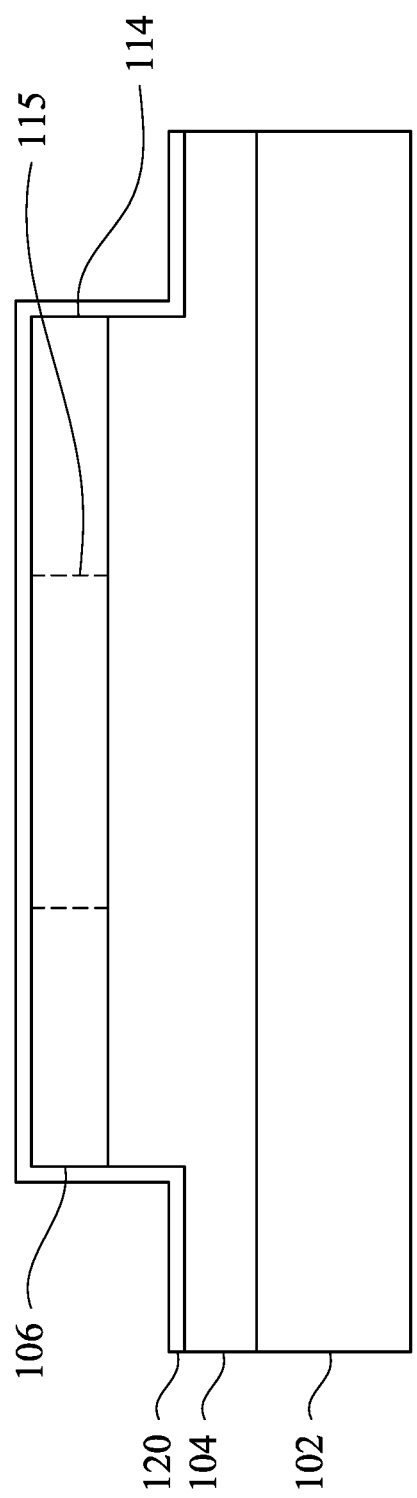
FIG. 8 illustrates a cross-sectional view of a formation of a gate dielectric layer in accordance with some embodiments.

In FIG. 8, a gate dielectric layer 120 is formed over the channel layer 106 and the buffer layer 104. The gate dielectric layer 120 may be a high-k (dielectric constant) dielectric layer such as HfO$_2$, Al$_2$O$_3$, LaO$_2$, TiO$_2$, HfZrO, Ta$_2$O$_3$, HfSiO$_4$, ZrO$_2$, ZrSiO$_2$, combinations thereof, or other suitable material. As illustrated in FIG. 8, the gate dielectric layer 120 may be deposited by a conformal deposition process. For example, the gate dielectric layer 120 may be deposited by CVD, ALD, or the like. The gate dielectric layer 120 may have a thickness of between about 2.5 nm and about 7.5 nm, such as about 5 nm.

Figure 9:
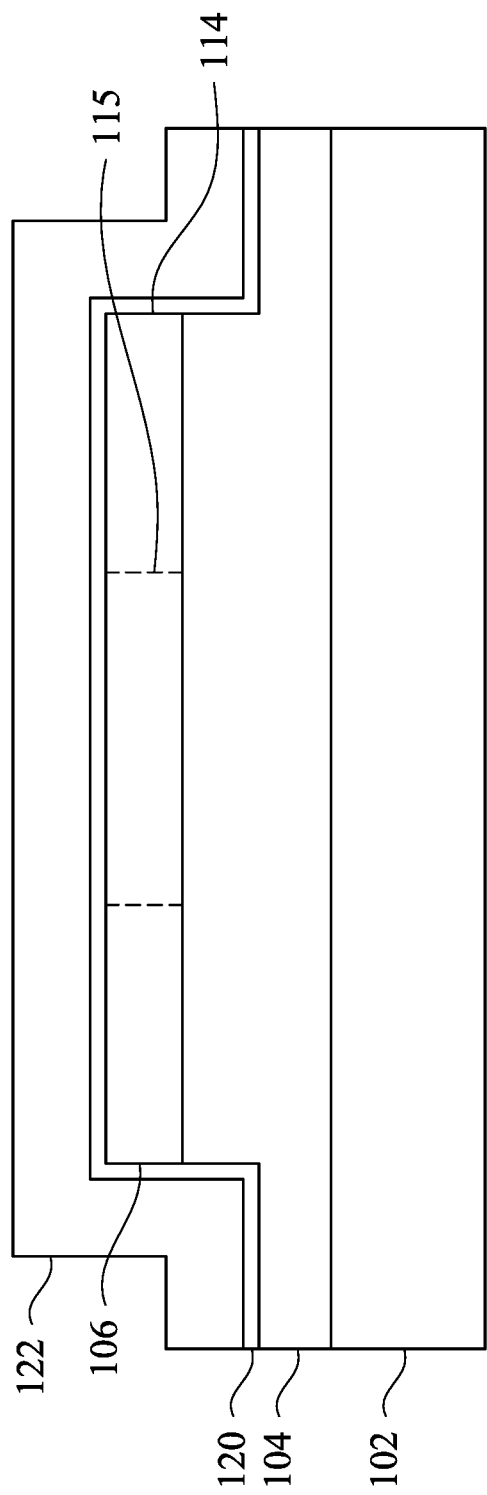
FIG. 9 illustrates a cross-sectional view of a formation of a metal gate layer in accordance with some embodiments.

In FIG. 9, a metal gate 122 is formed over the gate dielectric layer 120. The metal gate 122 may be formed of titanium nitride (TiN). In some embodiments (not separately illustrated), the metal gate 122 may include a work function tuning layer and a conductive material formed over the work function tuning layer. The work function tuning layer may be formed of TiN, TSN, WN, WCN, AlN, TaAlC, TiAl, TiAlN, WAlN, other suitable materials, or a combination thereof. The conductive material may be formed of W, Co, Ru, Al, or other suitable material. The metal gate 122 may be formed by a PVD process, such as sputtering. The metal gate 122 may have a thickness of between about 37.5 nm and about 112.5 nm, such as about 75 nm.

After the metal gate 122 is deposited, the resulting structure may undergo a post metal anneal (PMA) process. The PMA process may be performed at a temperature of between about 200° C. and about 400° C., such as about 300° C. The PMA process may be performed in an atmosphere including forming gas (e.g., a mixture of nitrogen ($N_2$) and hydrogen ($H_2$) gas) or the like. The PMA process improves characteristics of the resulting structure by reducing border traps near the interfaces of the gate dielectric layer 120.

Figure 10:
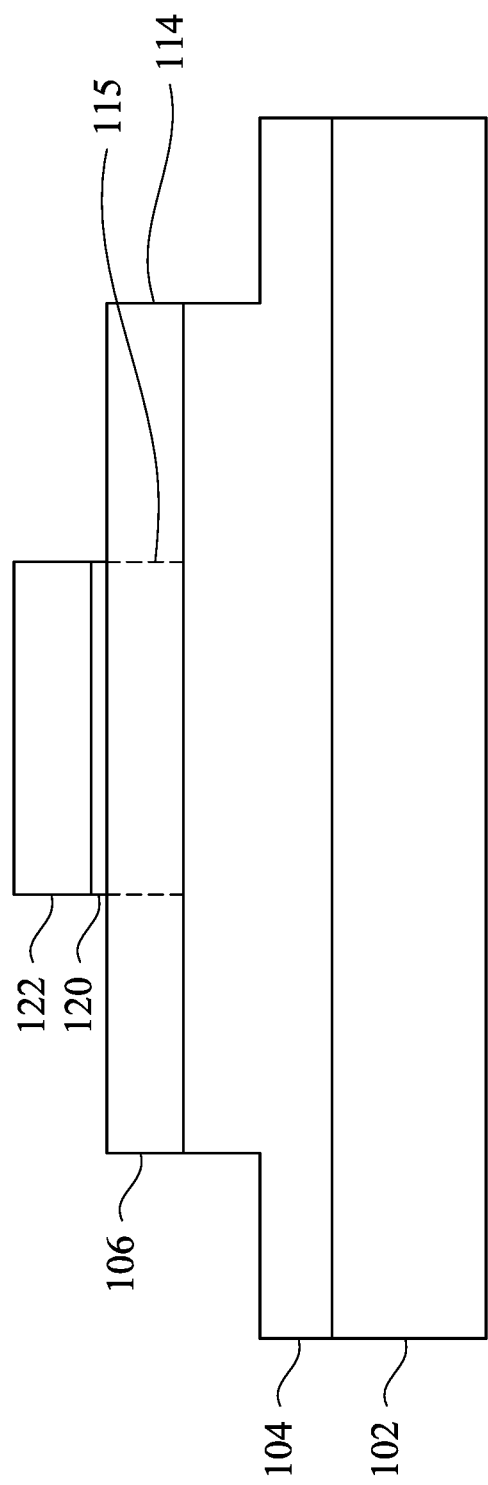
FIG. 10 illustrates a cross-sectional view of a formation of a gate stack in accordance with some embodiments.

In FIG. 10, portions of the metal gate 122 and the gate dielectric layer 120 are removed to form a gate stack. The gate stack includes the metal gate 122 and the gate dielectric layer 120. The gate stack may be patterned by depositing a photoresist (not separately illustrated) over the metal gate 122, exposing the photoresist to a patterned energy source (e.g., a patterned light source, an electron beam (e-beam) source, or the like), developing the photoresist, and etching the metal gate 122 and the gate dielectric layer 120 through the photoresist. The metal gate 122 and the gate dielectric layer 120 may be etched by a dry-etching process, such as RIE, NBE, combinations thereof, or the like. The etching process used to etch the metal gate 122 and the gate dielectric layer 120 may be anisotropic.

Figure 11:
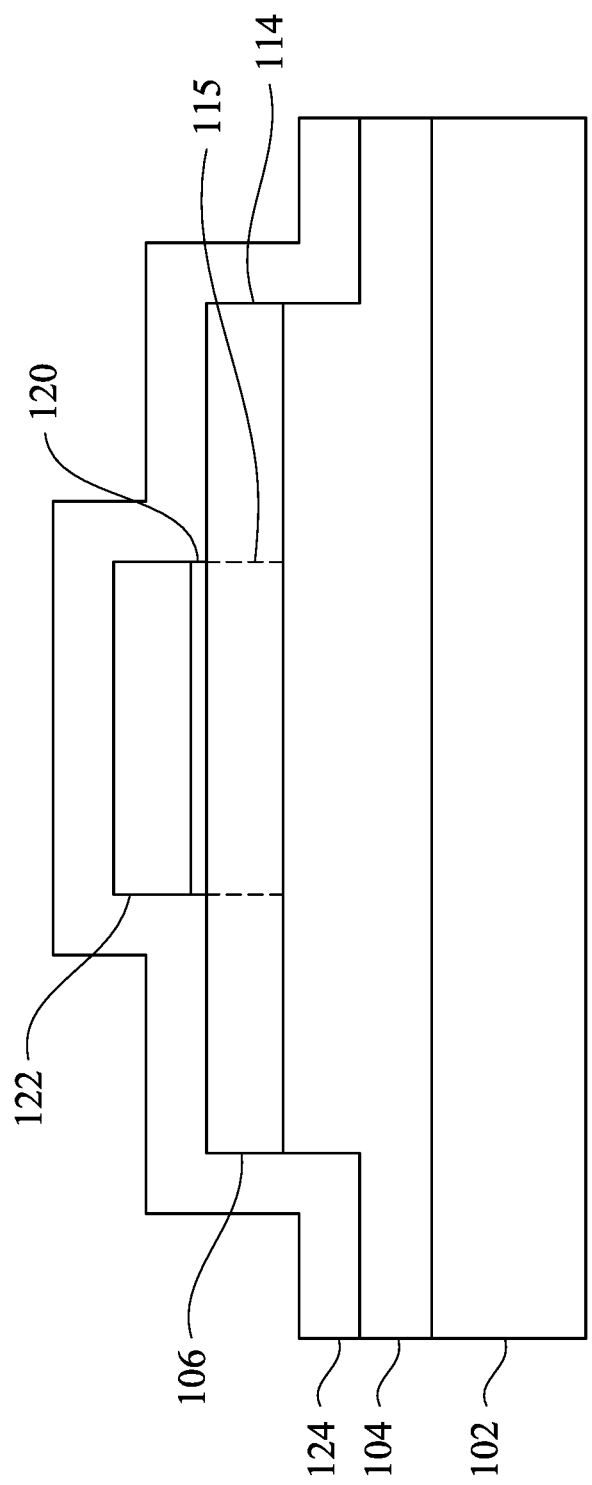
FIG. 11 illustrates a cross-sectional view of a formation of an inter-layer dielectric layer in accordance with some embodiments.

In FIG. 11, a third dielectric layer 124 is formed over the gate stack, the channel layer 106, and the buffer layer 104. The third dielectric layer 124 may be an inter-layer dielectric (ILD) layer. The third dielectric layer 124 may be formed of a dielectric material having a low dielectric constant (e.g., a low-k material). For example, the third dielectric layer 124 may be formed of silicon dioxide ($SiO_2$) silicon nitride ($Si_3N_4$), combinations or multiple layers thereof, or the like. The third dielectric layer 124 may be deposited using a conformal deposition process such as atomic layer deposition (ALD), physical vapor deposition (PVD), chemical vapor deposition (CVD), combinations thereof, or the like. The third dielectric layer 124 may have a thickness of between about 40 nm and about 120 nm, such as about 80 nm.

Figure 12A:
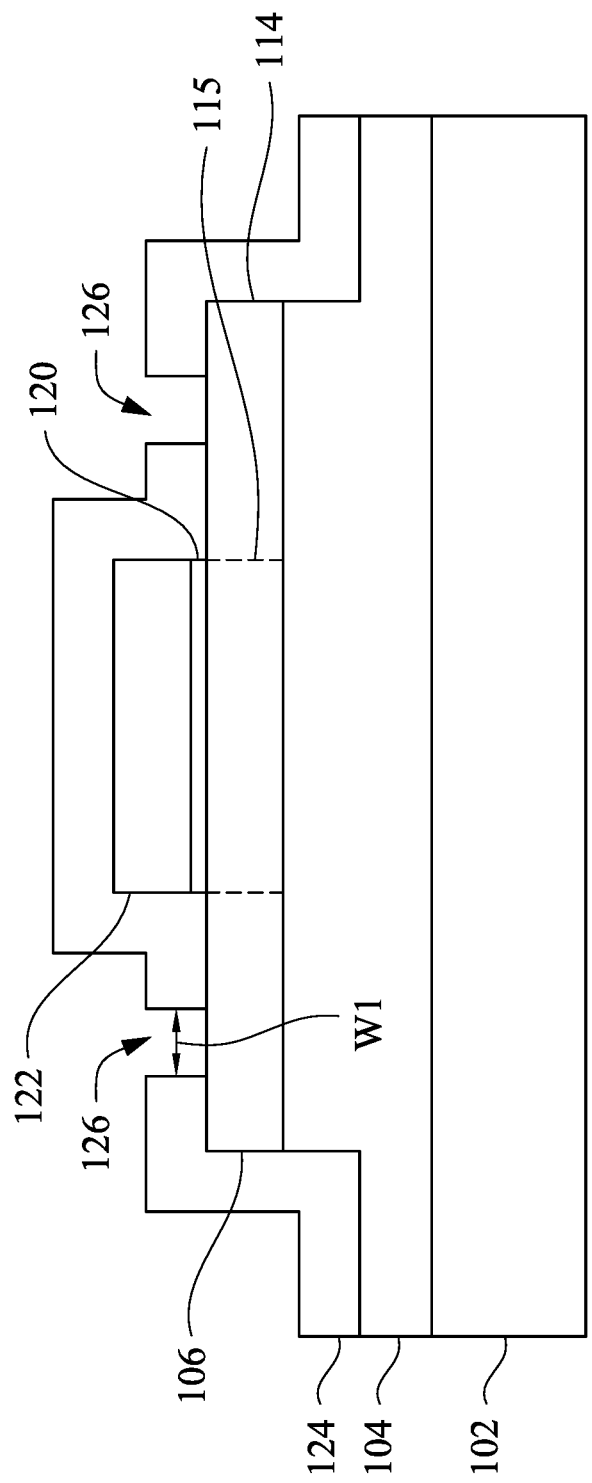
FIGS. 12A-12B illustrate cross-sectional views of formations of openings in the inter-layer dielectric layer in accordance with some embodiments.

In FIG. 12A, openings 126 are formed in the third dielectric layer 124. The openings 126 may extend through the third dielectric layer 124 to expose portions of the source/drain regions 114. The openings 126 may be formed by depositing a photoresist (not separately illustrated) over the third dielectric layer 124, exposing the photoresist to a patterned energy source (e.g., a patterned light source, an electron beam (e-beam) source, or the like), developing the photoresist, and etching the third dielectric layer 124 through the photoresist. The third dielectric layer 124 may be etched by a dry-etching process, such as RIE, NBE, combinations thereof, or the like. The etching process used to etch the third dielectric layer 124 may be anisotropic. The openings 126 may have a width W1 of between about 1 µm and about 3 µm, such as about 2 µm. The openings 126 may further have a length (not separately illustrated) of between about 1.5 µm and about 4.5 µm, such as about 3 µm.

Figure 12B:
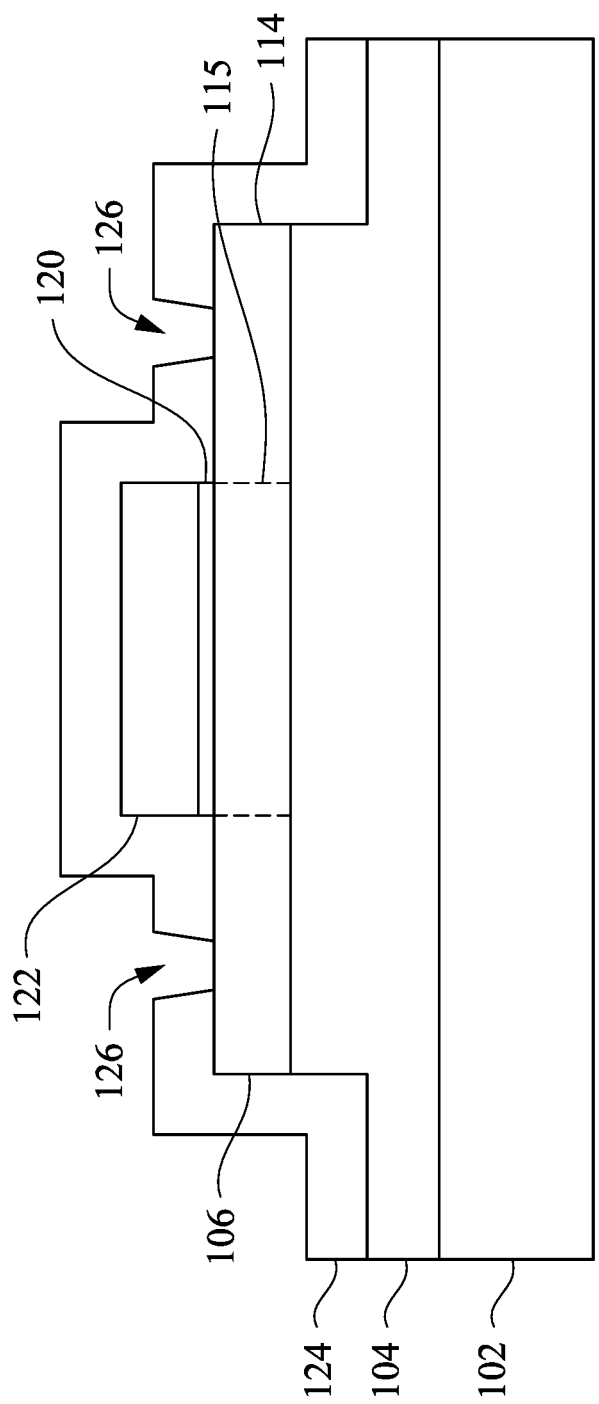

As illustrated in FIG. 12B, in some embodiments, the openings 126 may have tapered sidewalls. In other embodiments, the sidewalls of the openings 126 may be reverse tapered, have curved sidewalls, or the like. The openings 126 may have a square shape, a rectangular shape, a circular shape, an oval shape, or the like in a top-down view.

Figure 13:
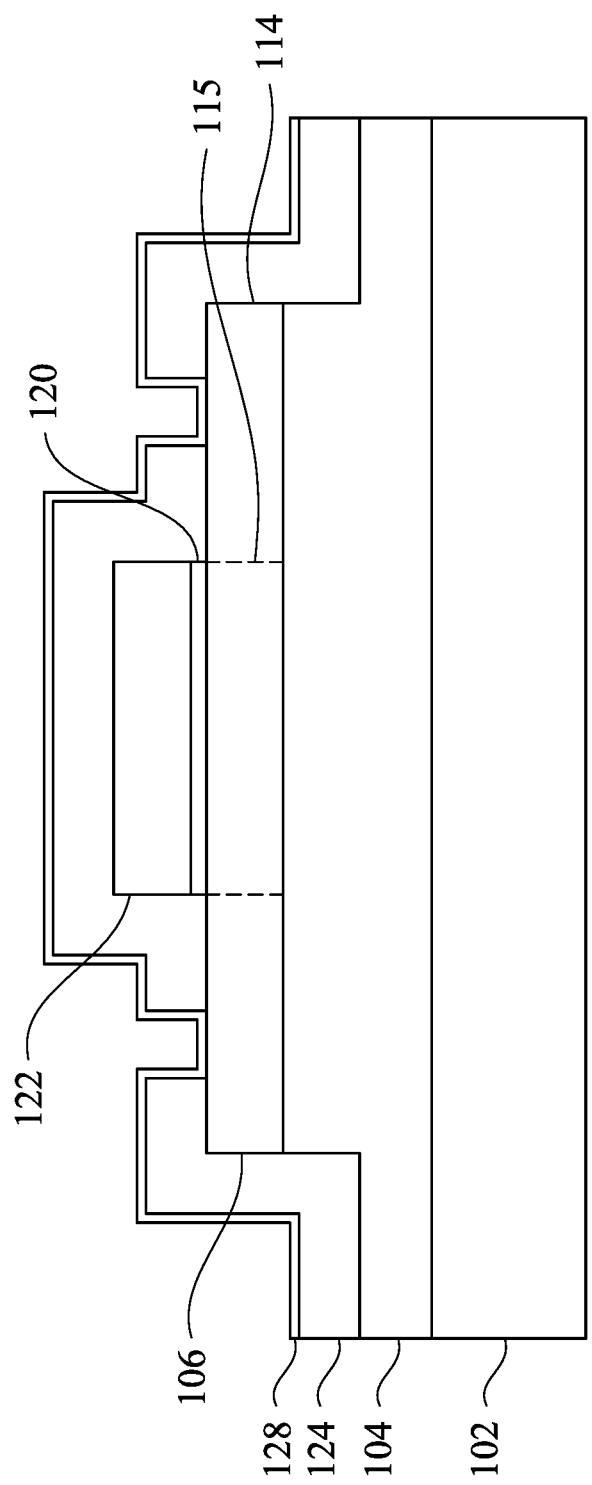
FIG. 13 illustrates a cross-sectional view of a formation of a conductive liner in accordance with some embodiments.

In FIG. 13, a conductive liner 128 is deposited over the third dielectric layer 124 and in the openings 126. The conductive liner 128 may comprise a conductive material such as titanium (Ti). The conductive liner 128 may be deposited by a conformal deposition process. For example, the conductive liner 128 may be deposited by a PVD process, such as sputtering. The conductive liner 128 may have a thickness of between about 0.1 nm and about 100 nm, such as about 10 nm or about 16.94 nm.

Figure 14:
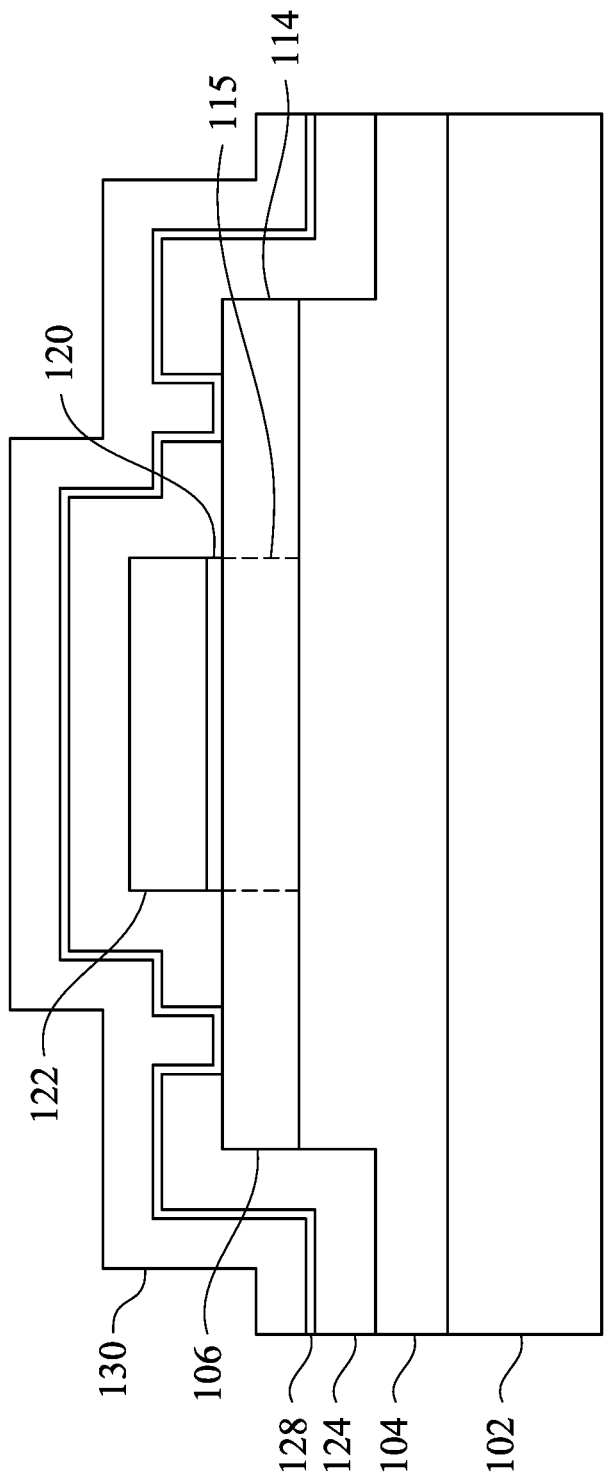
FIG. 14 illustrates a cross-sectional view of a formation of a conductive fill material in accordance with some embodiments.

In FIG. 14, a conductive fill material 130 is deposited over the conductive liner 128. The conductive fill material 130 may fill the remainder of the openings 126, as illustrated in FIG. 14. The conductive fill material 130 may comprise a conductive material such as aluminum-silicon-copper (Al-SiCu). The conductive fill material 130 may be deposited by a conformal deposition process. For example, the conductive fill material 130 may be deposited by a PVD process, such as sputtering. The conductive fill material 130 may have a thickness of between about 0.1 nm and about 1000 nm, such as about 200 nm or about 115.20 nm.

In some embodiments, the conductive fill material 130 may be formed of AlSiCu having the formula $Al_{(1-x-y)}Si_xCu_y$, wherein x is between about 1 atomic percent and about 2 atomic percent and y is between about 0.5 atomic percent and about 4 atomic percent. In other embodiments, x is about 0 atomic percent and y is between about 0.5 atomic percent and about 4 atomic percent. Increasing the concentration of copper in the conductive fill material 130 may lower the resistivity of the fill material 130, while decreasing the thermal stability of the conductive fill material 130. Likewise, increasing the concentration of silicon in the conductive fill material 130 may increase the resistivity of the fill material 130, while increasing the thermal stability of the conductive fill material 130.

Still further embodiments may include an additional conductive layer (illustrated as conductive layer 129 in FIG. 15C), such as a layer of nickel (Ni) or another conductive material, disposed in between the conductive liner 128 and the conductive fill material 130. The additional conductive layer may be deposited by a conformal deposition process. For example, the additional conductive layer may be deposited by a PVD process, such as sputtering. The additional conductive layer may have a thickness of between about 0.1 nm and about 100 nm. The additional conductive layer may increase the thermal stability of subsequently formed source/drain contacts (discussed below in reference to FIG. 15).

In FIG. 15, portions of the conductive liner 128 and the conductive fill material 130 are removed to form source/drain contacts. The source/drain contacts include the conductive liner and the conductive fill material (and the additional conductive layer, in some embodiments). The source/drain contacts may be patterned by depositing a photoresist (not separately illustrated) over the conductive fill material 130, exposing the photoresist to a patterned energy source (e.g., a patterned light source, an electron beam (e-beam) source, or the like), developing the photoresist, and etching the conductive fill material 130 and the conductive liner 128 through the photoresist. The conductive fill material 130 and the conductive liner 128 may be etched by a dry-etching process, such as RIE, NBE, combinations thereof, or the like. The etching process used to etch conductive fill material 130 and the conductive liner 128 may be anisotropic.

The source/drain contacts may have a low contact resistance. For example, the source/drain contacts may have a contact resistance of between about 0.0195 Ω·mm and about 0.0585 Ω·mm, such as about 0.039 Ω·mm. The source/drain contacts may further have a low specific contact resistivity. For example, the source/drain contacts may have a specific contact resistivity of between about $1.425 \times 10^{-7}$ Ω·cm$^2$ and about $4.275 \times 10^{-7}$ Ω·cm$^2$, such as about $2.85 \times 10^{-7}$ Ω·cm$^2$. As illustrated in FIG. 15, upper portions of the source/drain contacts, such as portions of the source/drain contacts disposed above the third dielectric layer 124, may have a width greater than the width W1 of the openings 126. The upper portions of the source/drain contacts may further have a length (not separately illustrated) greater than a length of the openings 126, described above.

In some embodiments, the third dielectric layer 124 may not be deposited before the conductive liner 128 and the conductive fill material 130 are formed and the conductive liner 128 and the conductive fill material 130 may be deposited directly on the source/drain regions 114. In these embodiments, the conductive liner 128 and the conductive fill material 130 may be etched to form source/drain contacts and an ILD layer may be deposited around the source/drain contacts. In still further embodiments, the source/drain contacts may further include one or more layers of platinum (Pt) deposited over the conductive fill material.

Figure 15A:
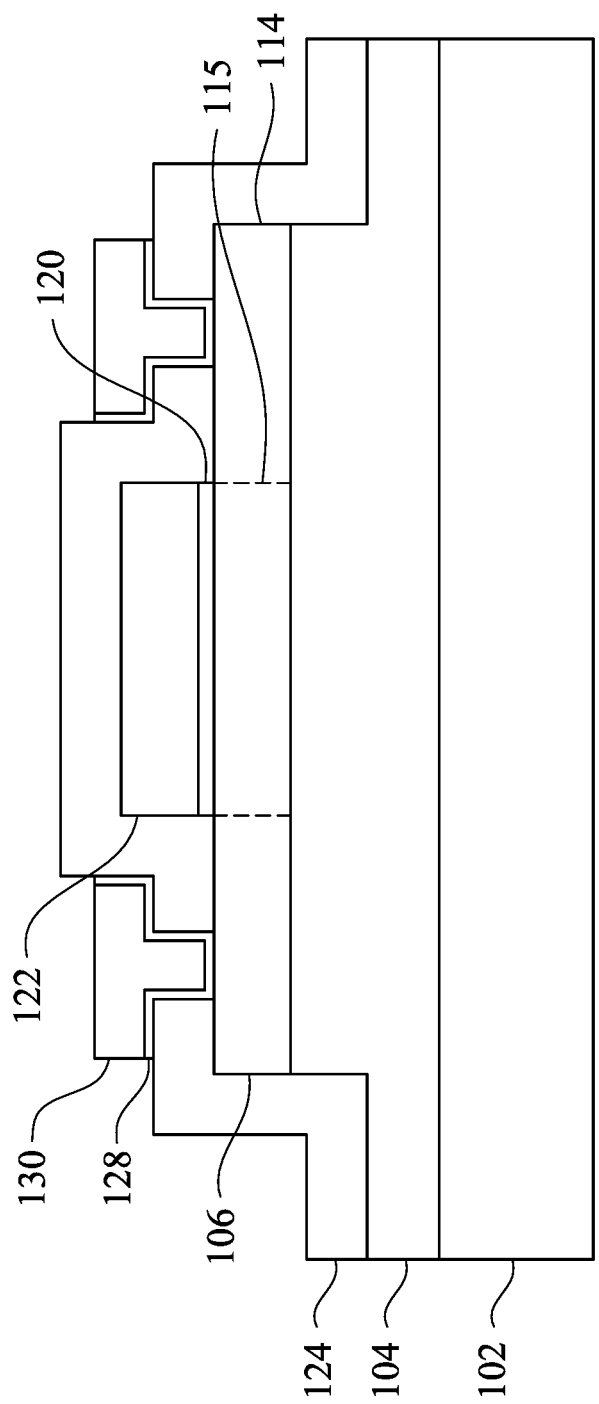
FIGS. 15A-15C illustrate cross-sectional views of formations of conductive contacts in accordance with some embodiments.
Figure 15B:
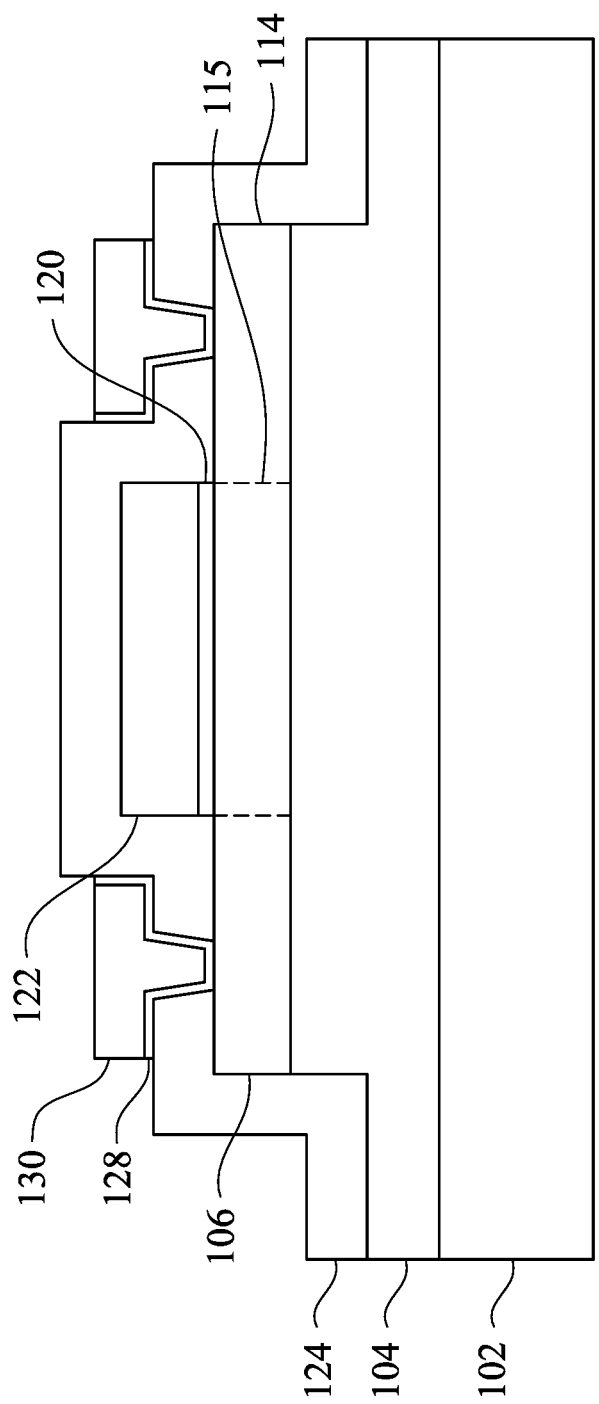

As illustrated in FIG. 15B, the source/drain contacts including the conductive liner 128 and the conductive fill material 130 may have any suitable shape, such as having a tapered shape in a region extending through the third dielectric layer 124. In various other embodiments, the portion of the source/drain contacts extending through the third dielectric layer 124 may have a reverse tapered shape, curved sidewalls, or the like. The top portion of the source/drain contacts extending above the third dielectric layer 124 may have rounded corners, tapered sidewalls, curved sidewalls, reverse tapered sidewalls, or the like. In addition, the top portion of the source/drain contacts may have any suitable shape in a top-down view, such as a square shape, a rectangular shape, a circular shape, an ellipsoidal shape, or the like.

Figure 15C:
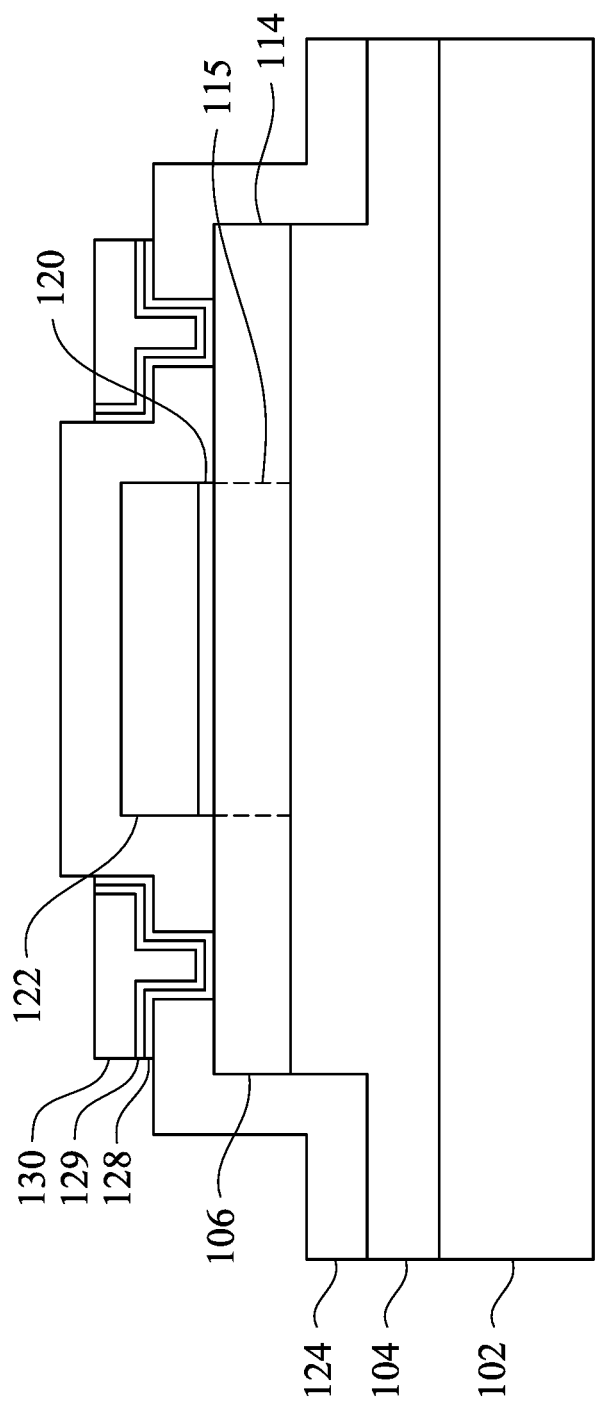

As illustrated in FIG. 15C, the source/drain contacts may further include a conductive layer 129 disposed between the conductive fill material 130 and the conductive liner 128. The conductive layer 129 may be formed of nickel (Ni) or the like. The conductive layer 129 may have a thickness of between about 0.1 nm and about 100 nm and may increase the thermal stability the source/drain contacts.

Figure 16:
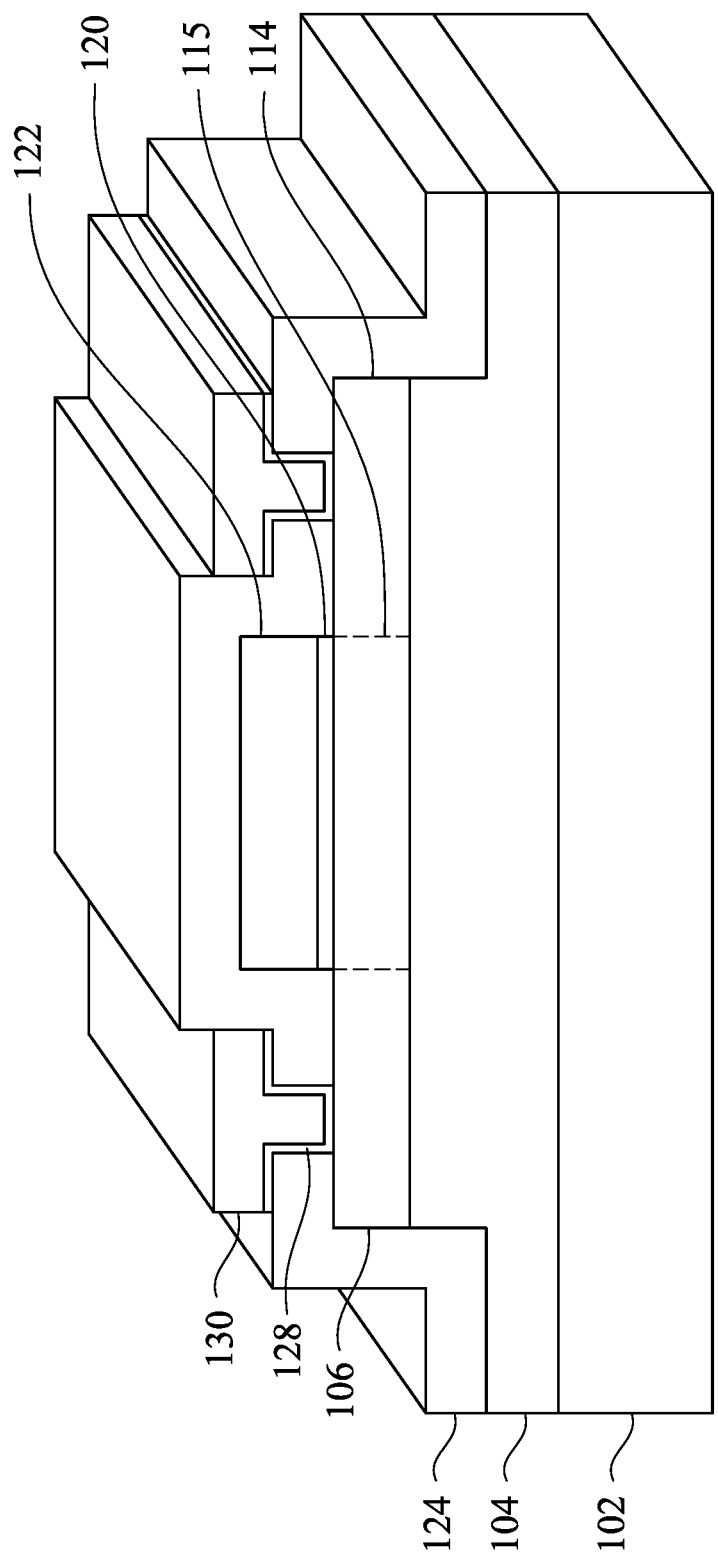
FIG. 16 illustrates a perspective view of a transistor including the conductive contacts in accordance with some embodiments.

FIG. 16 illustrates a perspective view of the transistor structure of FIG. 15A. As illustrated in FIG. 16, the transistor structure includes a substrate 102, a buffer layer 104 over the substrate 102, a channel layer 106 including source/drain regions 114 and a channel region 115 over the buffer layer 104, a gate stack including a gate dielectric layer 120 and a metal gate 122 over the channel layer 106. A third dielectric layer 124 extends over top surfaces and along sidewalls of the buffer layer 104, the channel layer 106, and the gate stack. Source/drain contacts including a conductive liner 128 and a conductive fill material 130 extend through the third dielectric layer to contact the source/drain regions 114.

Forming a semiconductor device according to the above-described embodiments results in gold-free (Au-free), low specific contact resistivity source/drain contacts, which may be used with an InGaAs semiconductor material. Because the source/drain contacts are gold-free, the cost of manufacturing the contacts is reduced. Moreover, because titanium and aluminum-silicon-copper are materials commonly used in silicon-based manufacturing technology, the above-described source/drain contacts can be integrated with existing manufacturing technology (e.g., the source/drain contacts may be compatible with silicon MOSFET technology, CMOS technology, and the like). The source/drain contacts may have a low specific contact resistivity and may not require a post-metal annealing (PMA) after forming the source/drain contacts.

In accordance with an embodiment, a semiconductor device includes a channel layer on a substrate; an interface layer on the channel layer, the interface layer including titanium (Ti), the interface layer contacting the channel layer; and a contact metal layer over the interface layer, the contact metal layer including aluminum silicon copper alloy (AlSiCu). In an embodiment, the channel layer includes indium gallium arsenide (InGaAs). In an embodiment, the channel layer includes indium arsenide (InAs), indium gallium phosphide (InGaP), indium aluminum arsenide (InAlAs), gallium nitride (GaN), indium gallium nitride (InGaN), aluminum gallium nitride (AlGaN), or silicon germanium (SiGe). In an embodiment, the substrate includes indium phosphide (InP). In an embodiment, the substrate includes silicon germanium (SiGe), gallium arsenide (GaAs), silicon (Si), germanium (Ge), silicon carbide (SiC), or sapphire ($Al_2O_3$). In an embodiment, the material of the contact metal layer is represented by the formula $Al_{(1-x-y)}Si_xCu_y$, x is between about 1 atomic percent and about 2 atomic percent, and y is between about 0.5 atomic percent and about 4 atomic percent. In an embodiment, the material of the contact metal layer is represented by the formula $Al_{(1-x-y)}Si_xCu_y$, x is about 0 atomic percent, and y is between about 0.5 atomic percent and about 4 atomic percent.

In accordance with another embodiment, a semiconductor device includes a substrate; a buffer layer over the substrate; a channel layer over the buffer layer; and a conductive contact in contact with the channel layer, the conductive contact including a conductive liner and a conductive fill material over the conductive liner, the conductive liner including titanium (Ti), the conductive fill material including aluminum silicon copper alloy (AlSiCu). In an embodiment, the semiconductor device further includes a gate stack over the channel layer, the gate stack including a gate dielectric layer and a gate electrode. In an embodiment, the gate dielectric layer includes aluminum oxide ($Al_2O_3$) and the gate electrode includes titanium nitride (TiN). In an embodiment, the channel layer includes a first source/drain region on a first side of the gate stack, the first source/drain region is doped with a silicon (Si) dopant, and the conductive contact is in contact with the first source/drain region. In an embodiment, the first source/drain region has a dopant concentration of the silicon dopant of between $1 \times 10^{18}$ cm$^3$ and $1 \times 10^{20}$ cm$^{-3}$. In an embodiment, the substrate includes indium phosphide (InP), the buffer layer includes indium aluminum arsenide (InAlAs), and the channel layer includes indium gallium arsenide (InGaAs). In an embodiment, the conductive liner has a thickness of between 0.1 nm and 100 nm and the conductive fill material has a thickness of between 0.1 nm and 1,000 nm.

In accordance with yet another embodiment, a method includes forming a channel layer over a substrate; forming a gate stack on the channel layer; forming an inter-layer dielectric layer on the channel layer and the gate stack; forming an opening in the inter-layer dielectric layer exposing the channel layer; and forming a conductive contact in the opening, the conductive contact including a conductive liner and a conductive fill material, the conductive liner including titanium (Ti), and the conductive fill material including aluminum silicon copper alloy (AlSiCu). In an embodiment, forming the conductive contact includes depositing a conductive liner in the opening; and depositing a conductive fill material over the conductive liner, the conductive liner and the conductive fill material filling the opening. In an embodiment, the conductive liner and the conductive fill material are deposited by sputtering. In an embodiment, the conductive liner has a thickness of between 0.1 nm and 100 nm, and the conductive fill material has a thickness of between 0.1 nm and 1,000 nm. In an embodiment, the method further includes forming a buffer layer on the substrate, the channel layer being formed on the buffer layer, the channel layer including indium gallium arsenide (InGaAs), and the buffer layer including indium aluminum arsenide (InAlAs). In an embodiment, the inter-layer dielectric layer includes silicon dioxide ($SiO_2$).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a channel layer on a substrate;
an interface layer on the channel layer, the interface layer comprising titanium (Ti), the interface layer contacting the channel layer;
an interlayer dielectric layer extending along a top surface and sidewalls of the channel layer, wherein bottom surfaces and sidewalls of the interface layer contact top surfaces and sidewalls of the interlayer dielectric layer;
a contact metal layer over the interface layer, the contact metal layer comprising aluminum silicon copper alloy (AlSiCu); and
a conductive layer between the contact metal layer and the interface layer, the conductive layer comprising nickel (Ni).

2. The semiconductor device of claim 1, wherein the channel layer comprises indium gallium arsenide (InGaAs).

3. The semiconductor device of claim 1, wherein the channel layer comprises indium arsenide (InAs), indium gallium phosphide (InGaP), indium aluminum arsenide (InAlAs), gallium nitride (GaN), indium gallium nitride (InGaN), aluminum gallium nitride (AlGaN), or silicon germanium (SiGe).

4. The semiconductor device of claim 1, wherein the substrate comprises indium phosphide (InP).

5. The semiconductor device of claim 1, wherein the substrate comprises silicon germanium (SiGe), gallium arsenide (GaAs), silicon (Si), germanium (Ge), silicon carbide (SiC), or sapphire ($Al_2O_3$).

6. The semiconductor device of claim 1, wherein the material of the contact metal layer is represented by the formula $Al_{(1-x-y)}Si_xCu_y$, wherein x is between 1 atomic percent and 2 atomic percent, and wherein y is between 0.5 atomic percent and 4 atomic percent.

7. The semiconductor device of claim 1, wherein the material of the contact metal layer is represented by the formula $Al_{(1-x-y)}Si_xCu_y$, wherein x is 0 atomic percent, and wherein y is between 0.5 atomic percent and 4 atomic percent.

8. A semiconductor device comprising:
a substrate;
a buffer layer over the substrate, the buffer layer comprising first sidewalls separated by a first width and second sidewalls separated by a second width greater than the first width;
a channel layer over the buffer layer, the channel layer comprising sidewalls aligned with the first sidewalls of the buffer layer; and
a conductive contact in contact with the channel layer, the conductive contact comprising a conductive liner and a conductive fill material over the conductive liner, the conductive liner comprising titanium (Ti), the conductive fill material comprising aluminum silicon copper alloy (AlSiCu).

9. The semiconductor device of claim 8, further comprising a gate stack over the channel layer, the gate stack comprising a gate dielectric layer and a gate electrode.

10. The semiconductor device of claim 9, wherein the gate dielectric layer comprises aluminum oxide ($Al_2O_3$) and the gate electrode comprises titanium nitride (TiN).

11. The semiconductor device of claim 9, wherein the channel layer comprises a first source/drain region on a first side of the gate stack, wherein the first source/drain region is doped with a silicon (Si) dopant, and wherein the conductive contact is in contact with the first source/drain region.

12. The semiconductor device of claim 11, wherein the first source/drain region has a dopant concentration of the silicon dopant of between $1\times10^{18}$ cm$^{-3}$ and $1\times10^{20}$ cm$^{-3}$.

13. The semiconductor device of claim 8, wherein the substrate comprises indium phosphide (InP), the buffer layer comprises indium aluminum arsenide (InAlAs), and the channel layer comprises indium gallium arsenide (InGaAs).

14. The semiconductor device of claim 8, wherein the conductive liner has a thickness of between 0.1 nm and 100 nm and the conductive fill material has a thickness of between 0.1 nm and 1,000 nm.

15. A semiconductor device comprising:
a channel layer over a substrate;
a gate stack on the channel layer;
an inter-layer dielectric layer on the channel layer and the gate stack, wherein the inter-layer dielectric layer contacts sidewalls of the gate stack and the channel layer; and
a conductive contact extending through the inter-layer dielectric layer to the channel layer, the conductive contact comprising a conductive liner and a conductive fill material, the conductive liner comprising titanium (Ti), and the conductive fill material comprising aluminum silicon copper alloy (AlSiCu).

16. The semiconductor device of claim 15, wherein the conductive liner has a thickness from 0.1 nm to 100 nm.

17. The semiconductor device of claim 15, wherein the conductive fill material comprises from 1 atomic percent to 2 atomic percent silicon and from 0.5 atomic percent to 4 atomic percent copper.

18. The semiconductor device of claim 15, further comprising an additional conductive layer between the conductive liner and the conductive fill material, the additional conductive layer comprising nickel.

19. The semiconductor device of claim 15, wherein the channel layer is disposed on a buffer layer, the buffer layer having a resistivity greater than about $10^5$ Ω·cm, the inter-layer dielectric layer contacting sidewalls of the buffer layer.

20. The semiconductor device of claim 15, wherein the inter-layer dielectric layer contacts a top surface of the channel layer and a top surface of the gate stack, wherein a thickness of the inter-layer dielectric layer over the top surface of the channel layer is equal to a thickness of the inter-layer dielectric layer over the top surface of the gate stack.

* * * * *